US011031056B2

(12) United States Patent
Kim (10) Patent No.: US 11,031,056 B2
(45) Date of Patent: Jun. 8, 2021

(54) CLOCK GENERATION CIRCUITRY FOR MEMORY DEVICE TO GENERATE MULTI-PHASE CLOCKS AND OUTPUT DATA CLOCKS TO SORT AND SERIALIZE OUTPUT DATA

(71) Applicant: SK hynix Inc., Gyeonggi-do (KR)

(72) Inventor: Kwang-Soon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/706,349

(22) Filed: Dec. 6, 2019

(65) Prior Publication Data

US 2020/0211606 A1 Jul. 2, 2020

(30) Foreign Application Priority Data

Dec. 31, 2018 (KR) .................. 10-2018-0173971

(51) Int. Cl.
| | | |
|---|---|---|
| *G11C 7/22* | (2006.01) | |
| *G11C 8/18* | (2006.01) | |
| *G11C 7/10* | (2006.01) | |
| G11C 29/02 | (2006.01) | |
| G11C 11/4063 | (2006.01) | |

(52) U.S. Cl.
CPC ............ *G11C 7/222* (2013.01); *G11C 7/1012* (2013.01); *G11C 8/18* (2013.01); *G11C 11/4063* (2013.01); *G11C 29/023* (2013.01); *G11C 2207/107* (2013.01)

(58) Field of Classification Search
CPC ......... G11C 7/222; G11C 8/18; G11C 7/1012; G11C 2207/107
See application file for complete search history.

(56) References Cited

U.S. PATENT DOCUMENTS

| 9,160,520 | B1* | 10/2015 | Hwang | .................. | H04J 3/047 |
|---|---|---|---|---|---|
| 2008/0253203 | A1* | 10/2008 | Bae | ...................... | G11C 7/1051 |
| | | | | | 365/189.15 |
| 2009/0219764 | A1* | 9/2009 | Shin | ..................... | G11C 7/1018 |
| | | | | | 365/189.02 |
| 2010/0104057 | A1 | 4/2010 | Nedovic et al. | | |
| 2014/0111256 | A1* | 4/2014 | Song | ...................... | H03M 9/00 |
| | | | | | 327/115 |
| 2014/0140151 | A1* | 5/2014 | Cha | ........................ | G11C 7/22 |
| | | | | | 365/194 |

(Continued)

FOREIGN PATENT DOCUMENTS

| KR | 10-0868016 | 11/2008 |
|---|---|---|
| KR | 10-2014-0052417 | 5/2014 |

(Continued)

*Primary Examiner* — Mushfique Siddique (74) *Attorney, Agent, or Firm* — IP & T Group LLP (57) ABSTRACT

A memory device may include a clock dividing circuit suitable for generating a plurality of internal clocks by dividing an external clock, a mode decision circuit suitable for determining an operation mode according to an input time point of a read command based on the internal clocks, a clock arranging circuit suitable for arranging the internal clocks in an order determined according to the operation mode, and outputting the arranged clocks as a plurality of data output clocks, and a data arranging circuit suitable for arranging read data according to the operation mode, and outputting the arranged data in response to the data output clocks.

20 Claims, 8 Drawing Sheets

(56) References Cited

U.S. PATENT DOCUMENTS

2018/0173270 A1* 6/2018 Lee .................. G11C 7/1066
2018/0336937 A1* 11/2018 Yoon ................. G11C 7/1066
2019/0156870 A1* 5/2019 Park ................. G11C 7/1066

FOREIGN PATENT DOCUMENTS

KR 10-2014-0064268 5/2014
KR 10-2018-0125827 11/2018

* cited by examiner

CLOCK GENERATION CIRCUITRY FOR MEMORY DEVICE TO GENERATE MULTI-PHASE CLOCKS AND OUTPUT DATA CLOCKS TO SORT AND SERIALIZE OUTPUT DATA

CROSS-REFERENCE TO RELATED APPLICATION

This application claims priority under 35 U.S.C. § 119 to Korean Patent Application No. 10-2018-0173971 filed on Dec. 31, 2018, which is incorporated herein by reference in its entirety.

BACKGROUND

1. Field

Exemplary embodiments relate to a memory device that sorts data based on a clock.

2. Discussion of the Related Art

Recently, with the increase in operation speed of memory systems, memory devices in the memory systems are required to have a high transfer rate. In order to satisfy a high data transfer rate or high-bandwidth data transfer, the memory devices apply prefetch to sort data. The prefetch refers to an operation of latching and deserializing data which are serially inputted.

In order to sort data in parallel or series, a memory device uses a method of dividing an internal clock. The memory device includes a clock generation circuit to generate multi-phase clocks having different phases by dividing the internal clock. The memory device sorts data based on the multi-phase clocks, and transfers the sorted data.

SUMMARY

Various embodiments are directed to a memory device capable of adjusting the order of sorting internal clocks divided from an external clock according to an input time point of a command, and thus secure a valid window of data which are sorted based on the internal clocks.

In an embodiment, a clock generation circuit may include: a clock dividing circuit suitable for generating a first internal clock, a second internal clock, a third internal clock and a fourth internal clock by dividing an external clock; a mode signal generation circuit suitable for generating a first mode signal and a second mode signal according to an input time point of a read command based on the first and third internal clocks; a first shifting circuit suitable for generating a plurality of first shifting signals by shifting the first mode signal in response to the first internal clock; a second shifting circuit suitable for generating a plurality of second shifting signals by shifting the second mode signal in response to the third internal clock; and a clock arranging circuit suitable for arranging the first to fourth internal clocks and outputting the arranged clocks as a first data output clock, a second data output clock, a third data output clock and a fourth data output clock, in response to the plurality of first and second shifting signals.

In an embodiment, a memory device may include: a clock dividing circuit suitable for generating a plurality of internal clocks by dividing an external clock; a mode decision circuit suitable for determining an operation mode according to an input time point of a read command based on the internal clocks; a clock arranging circuit suitable for arranging the internal clocks in an order determined according to the operation mode, and outputting the arranged clocks as a plurality of data output clocks; and a data arranging circuit suitable for arranging read data according to the operation mode, and outputting the arranged data in response to the data output clocks.

In an embodiment, a memory device may include: a clock generation circuit suitable for receiving an external clock, generating a plurality of internal clocks by dividing the external clock, and arranging the plurality of internal clocks according to an operation mode, which is determined based on an input timing of a read command, to generate a plurality of data output clocks; and a data arranging circuit suitable for receiving a plurality of data in parallel from a memory cell array, arranging the plurality of data according to the operation mode to generate arranged multiple data and serializing the arranged multiple data to output serialized data according to the plurality of data output clocks.

DETAILED DESCRIPTION

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other forms that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

Figure 1:
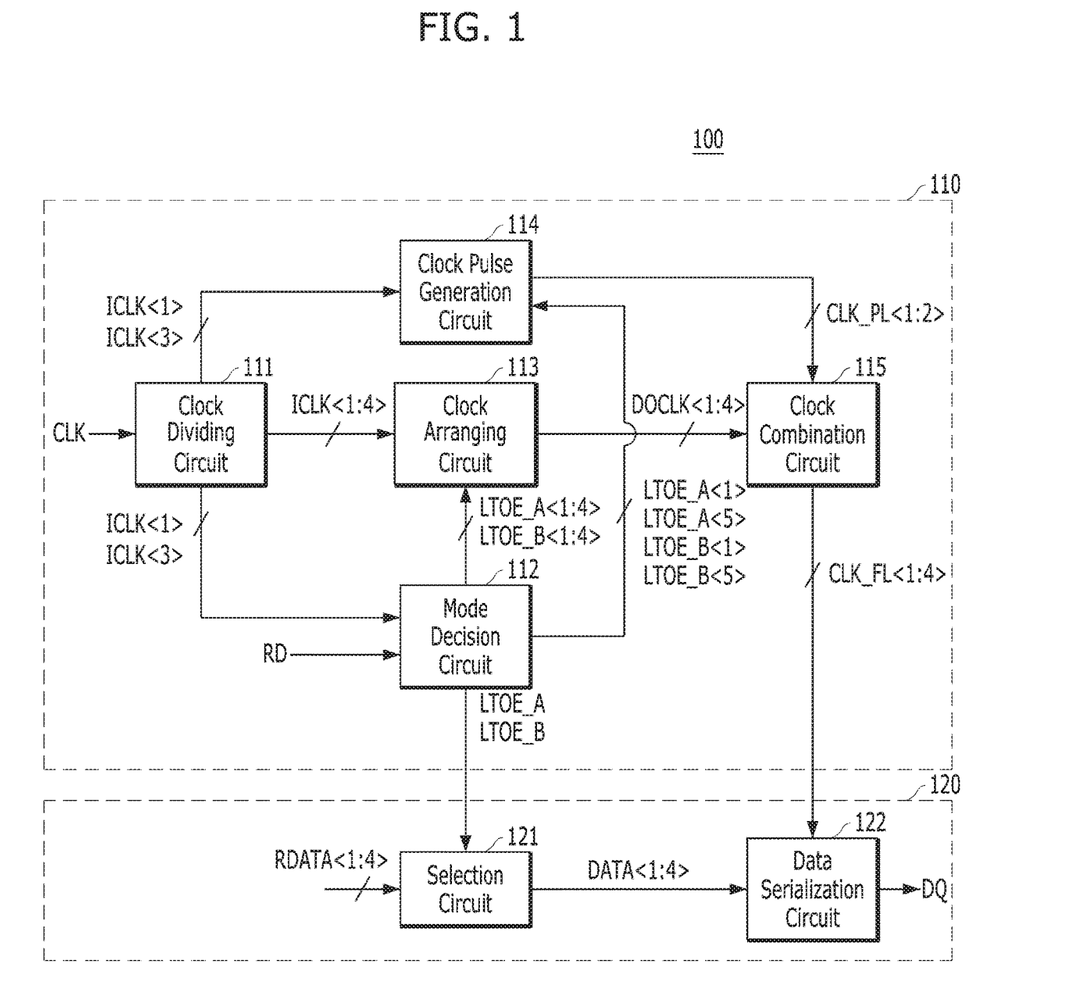
FIG. 1 is a block diagram illustrating a memory device in accordance with an embodiment.

FIG. 1 is a block diagram illustrating a memory device 100 in accordance with an embodiment.

Referring to FIG. 1, the memory device 100 may include a clock generation circuit 110 and a data arranging circuit 120. The clock generation circuit 110 may include a clock dividing circuit 111, a mode decision circuit 112, a clock arranging circuit 113, a clock pulse generation circuit 114 and a clock combination circuit 115. The data arranging circuit 120 may include a selection circuit 121 and a data serialization circuit 122. The clock dividing circuit 111, the mode decision circuit 112, the clock arranging circuit 113, the clock pulse generation circuit 114, the clock combination circuit 115, the selection circuit 121 and the data serialization circuit 122 include all circuits, systems, software, firmware and devices necessary for their respective operations and functions.

The clock dividing circuit 111 may generate a plurality of internal clocks ICLK<1:4> having different phases by dividing an external clock CLK. The external clock CLK may be set to a signal which is periodically toggled. The clock dividing circuit 111 may generate first to fourth internal clocks ICLK<1:4> having a phase difference of 90° at first rising/falling edges and second rising/falling edges of the external clock CLK. However, the present embodiment is not limited thereto, but may be implemented to generate various numbers of internal clocks.

The mode decision circuit 112 may determine an operation mode according to an input time point of a read command RD, based on the first and third internal clocks ICLK<1> and ICLK<3>. The mode decision circuit 112 may generate first and second mode signals LTOE_A and LTOE_B indicating the determined operation mode and a plurality of first and second shifting signals LTOE_A<1:5> and LTOE_B<1:5> corresponding to the first and second mode signals LTOE_A and LTOE_B, respectively. The operation of the mode decision circuit 112 will be described in more detail with reference to FIG. 2.

The clock arranging circuit 113 may arrange the first to fourth internal clocks ICLK<1:4> in an order which is decided according to the operation mode, and output the sorted clocks as first to fourth data output clocks DOCLK<1:4>. The clock arranging circuit 113 may sort the first to fourth internal clocks ICLK<1:4> in response to first to fourth first shifting signals LTOE_A<1:4> and first to fourth second shifting signals LTOE_B<1:4> among the plurality of first and second shifting signals LTOE_A<1:5> and LTOE_B<1:5>, and output the sorted clocks as the first to fourth data output clocks DOCLK<1:4>.

The clock pulse generation circuit 114 may generate first and second clock pulses CLK_PL<1:2> with the third and first internal clocks ICLK<3> and ICLK<1>. In particular, the clock pulse generation circuit 114 may generate the first and second clock pulses CLK_PL<1:2> in response to the first and last first shifting signals LTOE_A<1> and LTOE_<5> and the first and last second shifting signals LTOE_<1> and LTOE_B<5> among the plurality of first and second shifting signals LTOE_A<1:5> and LTOE_B<1:5>.

The clock combination circuit 115 may combine the first to fourth data output clocks DOCLK<1:4> and the first and second clock pulses CLK_PL<1:2>, and output the combined clocks as first to fourth final clocks CLK_FL<1:4>. The operation of the clock combination circuit 115 will be described in more detail with reference to FIG. 6.

The selection circuit 121 may sort data RDATA<1:4> read from a memory cell array (not illustrated) according to the operation mode decided by the mode decision circuit 112. The selection circuit 121 may sort the data RDATA<1:4> inputted through first to fourth input nodes and output the sorted data DATA<1:4> to first to fourth output nodes, in response to the first and second mode signals LTOE_A/B.

When the first mode signal LTOE_A is activated, the selection circuit 121 may sort the data RDATA<1:4> inputted through the first to fourth input nodes for the third, fourth, first and second output nodes, respectively, and sequentially output the sorted data DATA<3><4><1><2>. When the second mode signal LTOE_B is activated, the selection circuit 121 may sort the data RDATA<1:4> inputted through the first to fourth input nodes for the first to fourth output nodes, respectively, and sequentially output the sorted data DATA<1:4>.

The data serialization circuit 122 may output the sorted data DATA<1:4> to a data pad DQ in response to the first to fourth final clocks CLK_FL<1:4>. The data serialization circuit 122 may serialize the data DATA<1:4> inputted in parallel in response to the first to fourth final clocks CLK_FL<1:4>, and output the serialized data to the data pad DQ.

Figure 2:
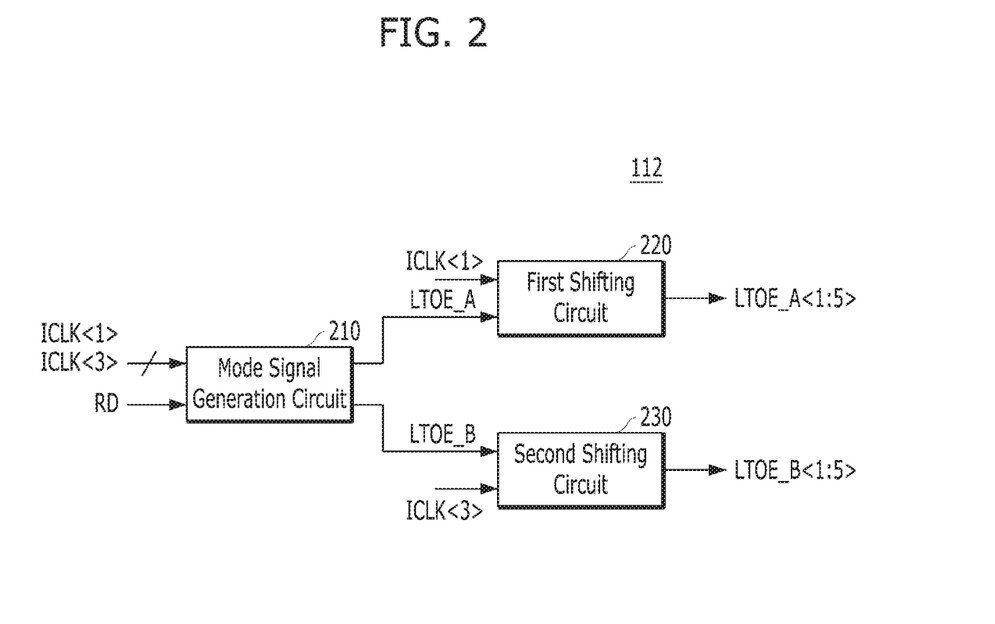
FIG. 2 is a block diagram illustrating a mode decision circuit illustrated in FIG. 1.

FIG. 2 is a block diagram illustrating the mode decision circuit 112 illustrated in FIG. 1.

Referring to FIG. 2, the mode decision circuit 112 may include a mode signal generation circuit 210, a first shifting circuit 220, and a second shifting circuit 230.

The mode signal generation circuit 210 may generate the first and second mode signals LTOE_A/LTOE_B according to an input time point of the read command RD, based on the first and third internal docks ICLK<1> and ICLK<3>. When the read command RD is inputted in synchronization with the first internal clock ICLK<1>, the mode signal generation circuit 210 may activate the first mode signal LTOE_A. When the read command RD is inputted in synchronization with the third internal clock ICLK<3>, the mode signal generation circuit 210 may activate the second mode signal LTOE_B.

When the first mode signal LTOE_A is activated, the first shifting circuit 220 may generate the plurality of first shifting signals LTOE_A<1:5> by shifting the first mode signal LTOE_A, in response to the first internal clock ICLK<1>. When the second mode signal LTOE_B is activated, the second shifting circuit 230 may generate the plurality of second shifting signals LTOE_B<1:5> by shifting the second mode signal LTOE_B, in response to the third internal clock ICLK<3>.

Figure 3:
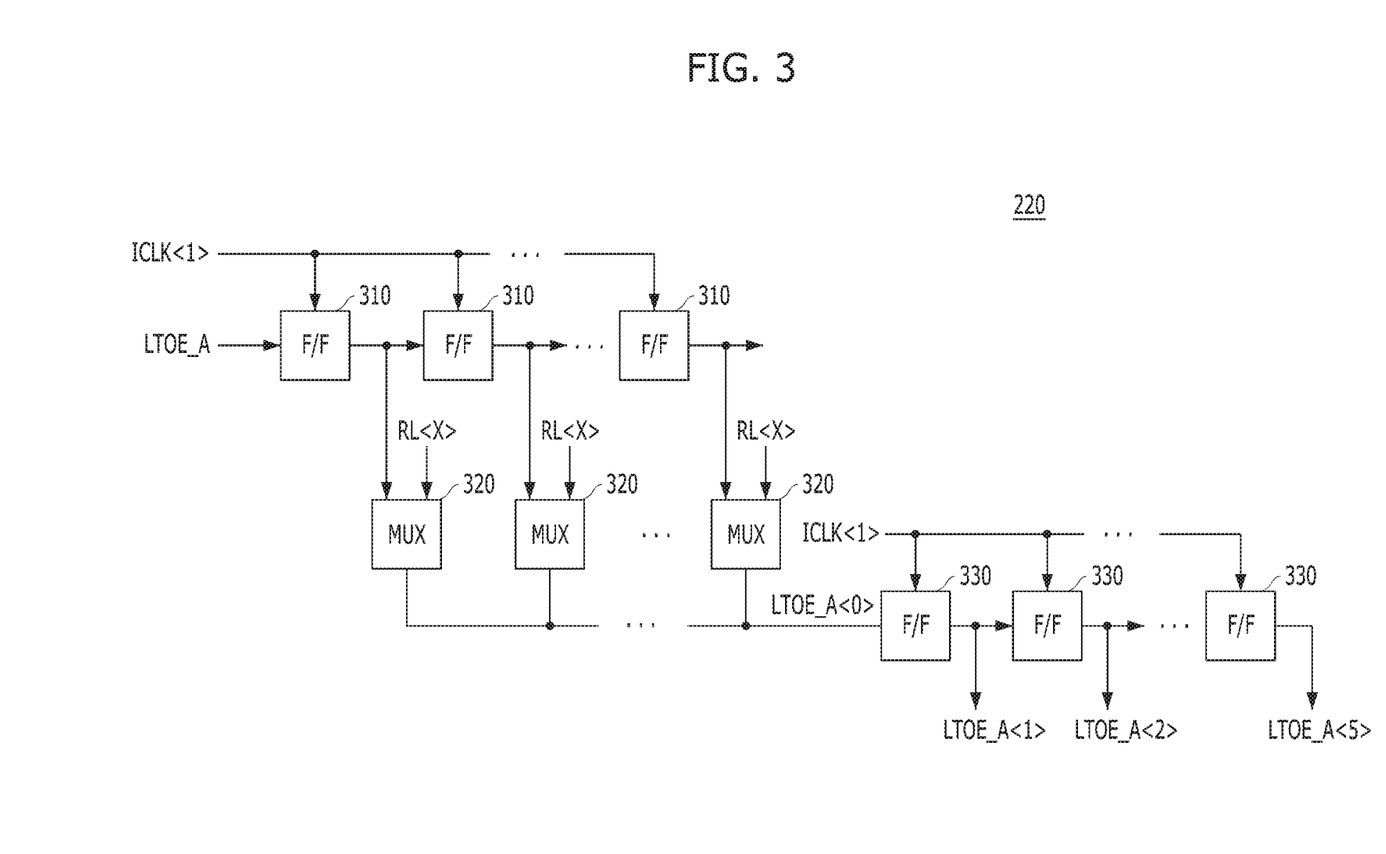
FIG. 3 is a block diagram illustrating a first shifting circuit illustrated in FIG. 2.

FIG. 3 is a block diagram illustrating the first shifting circuit 220 illustrated in FIG. 2. Since the first and second shifting circuits 220 and 230 have the same configuration except that input signals are different, the first shifting circuit 220 will be representatively described.

Referring to FIG. 3, the first shifting circuit 220 may include a plurality of first flip-flops (F/Fs) 310, a plurality of multiplexers (MUXs) 320 and a plurality of second flip-flops (F/Fs) 330. The first shifting circuit 220 may generate the plurality of first shifting signals LTOE_A<1:5> by delaying the first mode signal LTOE_A by a time corresponding to read latency in synchronization with the first internal clock ICLK<1> and shifting the delayed signal LTOE_A<0>.

The plurality of first flip-flops 310 may shift the first mode signal LTOE_A in response to the first internal clock ICLK<1>. At this time, a signal RL<X> inputted to each of the multiplexers 320 may be activated in response to the read latency. Therefore, through the multiplexer 320 corresponding to the activated signal RL<X>, the first mode signal LTOE_A may be delayed by the time corresponding to the read latency and outputted as the delayed signal LTOE_A<0>.

The plurality of second flip-flops 330 may generate the plurality of first shifting signals LTOE_A<1:5> by shifting the delayed signal LTOE_A<0> in response to the first internal clock ICLK<1>. The plurality of second flip-flops 330 may generate five first shifting signals LTOE_A<1:5> having a phase difference corresponding to 90° of the first internal clock ICLK<1>. However, the present embodiment is not limited thereto, but may be implemented to generate various numbers of shifting signals.

Similarly, the second shifting circuit 230 of FIG. 2 may generate the plurality of second shifting signals LTOE_B<1:5> by delaying the second mode signal LTOE_B by the time corresponding to the read latency in synchronization with the third internal clock ICLK<3> and shifting the delayed signal. The second shifting circuit 230 may generate five second shifting signals LTOE_B<1:5> having a phase difference corresponding to 90° of the third internal clock ICLK<3>.

Figure 4:
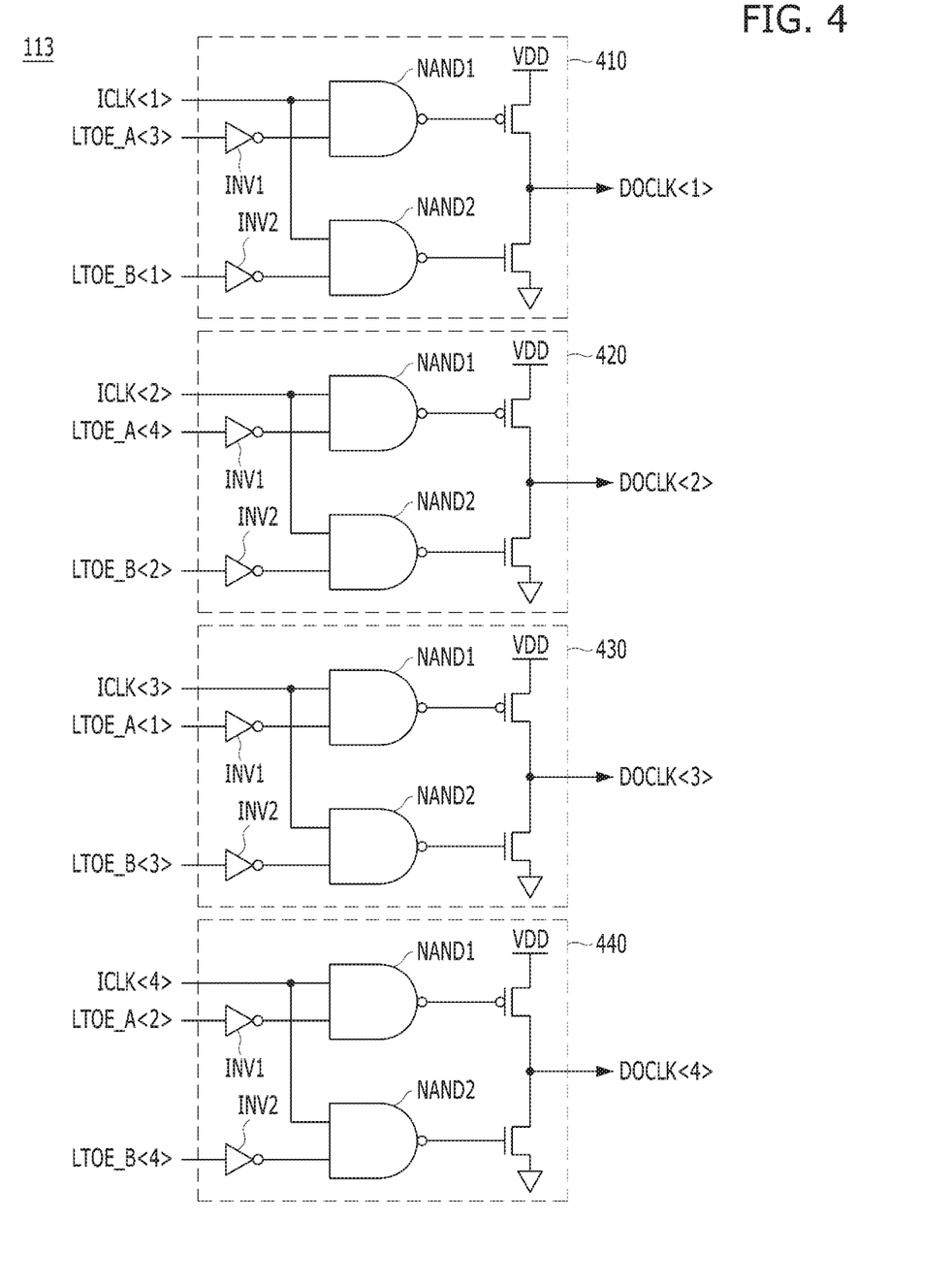
FIG. 4 is a circuit diagram illustrating a clock arranging circuit illustrated in FIG. 1.

FIG. 4 is a circuit diagram illustrating the dock arranging circuit 113 illustrated in FIG. 1.

Referring to FIG. 4, the clock arranging circuit 113 may include first to fourth clock transfer circuits 410 to 440. Each of the first to fourth clock transfer circuits 410 to 440 may include first and second NAND gates NAND1 and NAND2 and first and second inverters INV1 and INV2. The first to fourth clock transfer circuits 410 to 440 include all circuits, systems, software, firmware and devices necessary for their respective operations and functions.

The first clock transfer circuit 410 may transfer the first internal clock ICLK<1> as the first data output clock DOCLK<1> in response to the third first shifting signal LTOE_A<3> of the plurality of first shifting signals LTOE_A<1:5> and the first second shifting signal LTOE_B<1> of the plurality of second shifting signals LTOE_B<1:5>. At this time, the plurality of first and second shifting signals LTOE_A<1:5> and LTOE_B<1:5> may be signals which are activated to a logic low level.

Therefore, when the third first shifting signal LTOE_A<3> is activated to a logic low level, a signal inverted to a logic high level by the first inverter INV1 may be inputted to the first NAND gate NAND1. Thus, the first NAND gate NAND1 may turn on/turn off a PMOS transistor to output the first data output clock DOCLK<1>, in response to the first internal clock ICLK<1>.

When the first second shifting signal LTOE_B<1> is activated to a logic low level, a signal inverted to a logic high level by the second inverter INV2 may be inputted to the second NAND gate NAND2. Therefore, the second NAND gate NAND2 may turn on/turn off an NMOS transistor to output the first data output clock DOCLK<1>, in response to the first internal clock ICLK<1>.

Similarly, the second clock transfer circuit 420 may transfer the second internal clock ICLK<2> as the second data output clock DOCLK<2> in response to the fourth first shifting signal LTOE_A<4> of the plurality of first shifting signals LTOE_A<1:5> and the second second shifting signal LTOE_B<2> of the plurality of second shifting signals LTOE_B<1:5>. The third clock transfer circuit 430 may transfer the third internal clock ICLK<3> as the third data output clock DOCLK<3> in response to the first first shifting signal LTOE_A<1> of the plurality of first shifting signals LTOE_A<1:5> and the third second shifting signal LTOE_B<3> of the plurality of second shifting signals LTOE_B<1:5>. The fourth clock transfer circuit 440 may transfer the fourth internal clock ICLK<4> as the fourth data output clock DOCLK<4> in response to the second first shifting signal LTOE_A<2> of the plurality of first shifting signals LTOE_A<1:5> and the fourth second shifting signal LTOE_B<4> of the plurality of second shifting signals LTOE_B<1:5>.

That is, the clock arranging circuit 113 may transfer the first to fourth internal clocks ICLK<1:4> as the first to fourth data output clocks DOCLK<1:4> in response to the third, fourth, first and second first shifting signals LTOE_A<3>, LTOE_A<4>, LTOE_A<1> and LTOE_A<2>, respectively, among the plurality of first shifting signals LTOE_A<1:5>. Furthermore, the clock arranging circuit 113 may transfer the first to fourth internal clocks ICLK<1:4> as the first to fourth data output clocks DOCLK<1:4> in response to the first to fourth second shifting signals LTOE_B<1:4>, respectively, among the plurality of second shifting signals LTOE_B<1:5>.

Figure 5:
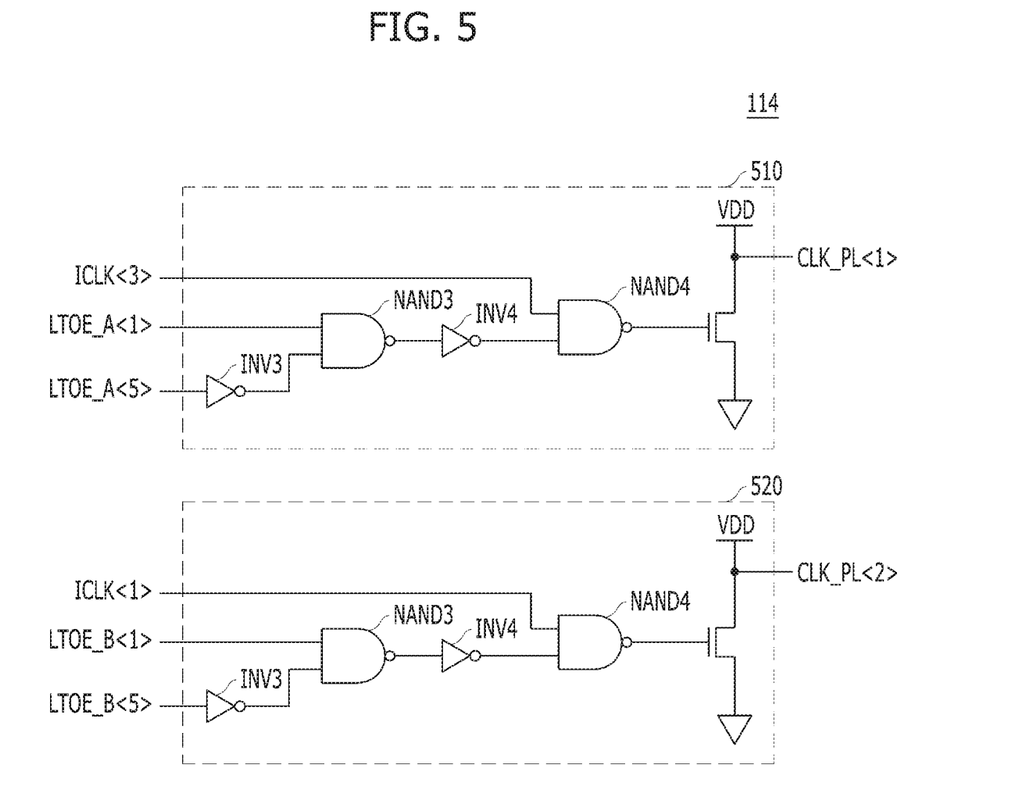
FIG. 5 is a circuit diagram illustrating a clock pulse generation circuit illustrated in FIG. 1.

FIG. 5 is a circuit diagram illustrating the clock pulse generation circuit 114 illustrated in FIG. 1.

Referring to FIG. 5, the clock pulse generation circuit 114 may include first and second clock pulse generation circuits 510 and 520. Each of the first and second clock pulse generation circuits 510 and 520 may include third and fourth NAND gates NAND3 and NAND4 and third and fourth inverters INV3 and INV4. The first and second clock pulse generation circuits 510 and 520 include all circuits, systems, software, firmware and devices necessary for their respective operations and functions.

The first clock pulse generation circuit 510 may output the third internal clock ICLK<3> as the first clock pulse CLK_PL<1> in response to the first and fifth first shifting signals LTOE_A<1> and LTOE_A<5> among the plurality of first shifting signals LTOE_A<1:5>. In an interval where the first and fifth first shifting signals LTOE_A<1> and LTOE_A<5> among the plurality of first shifting signals LTOE_A<1:5> have a logic high level and a logic low level, respectively, the first clock pulse generation circuit 510 may output the third internal clock ICLK<3> as the first clock pulse CLK_PL<1>.

Specifically, when the first and fifth first shifting signals LTOE_A<1> and LTOE_A<5> among the plurality of first shifting signals LTOE_A<1:5> have a logic high level and a logic low level, respectively, the third NAND gate NAND3 may output a logic low-level output signal. The fourth inverter INV4 may invert the output signal of the third NAND gate NAND3, and input a logic high-level signal to the fourth NAND gate NAND4.

Therefore, in the interval where the first and fifth first shifting signals LTOE_A<1> and LTOE_A<5> among the plurality of first shifting signals LTOE_A<1:5> have a logic high level and a logic low level, respectively, the fourth NAND gate NAND4 may turn on/turn off an NMOS transistor in response to the third internal clock ICLK<3>. In this interval, as the third internal clock ICLK<3> changes to a logic high/low level, the first clock pulse CLK_PL<1> may also change to a logic high/low level.

Similarly, the second clock pulse generation circuit 520 may output the first internal clock ICLK<1> as the second clock pulse CLK_PL<2> in response to the first and fifth second shifting signals LTOE_B<1> and LTOE_B<5> among the plurality of second shifting signals LTOE_B<1:5>. In an interval where the first and fifth second shifting signals LTOE_B<1> and LTOE_B<5> among the plurality of second shifting signals LTOE_B<1:5> have a logic high level and a logic low level, respectively, the second clock pulse generation circuit 520 may output the first internal clock ICLK<1> as the second clock pulse CLK_PL<2>.

Figure 6:
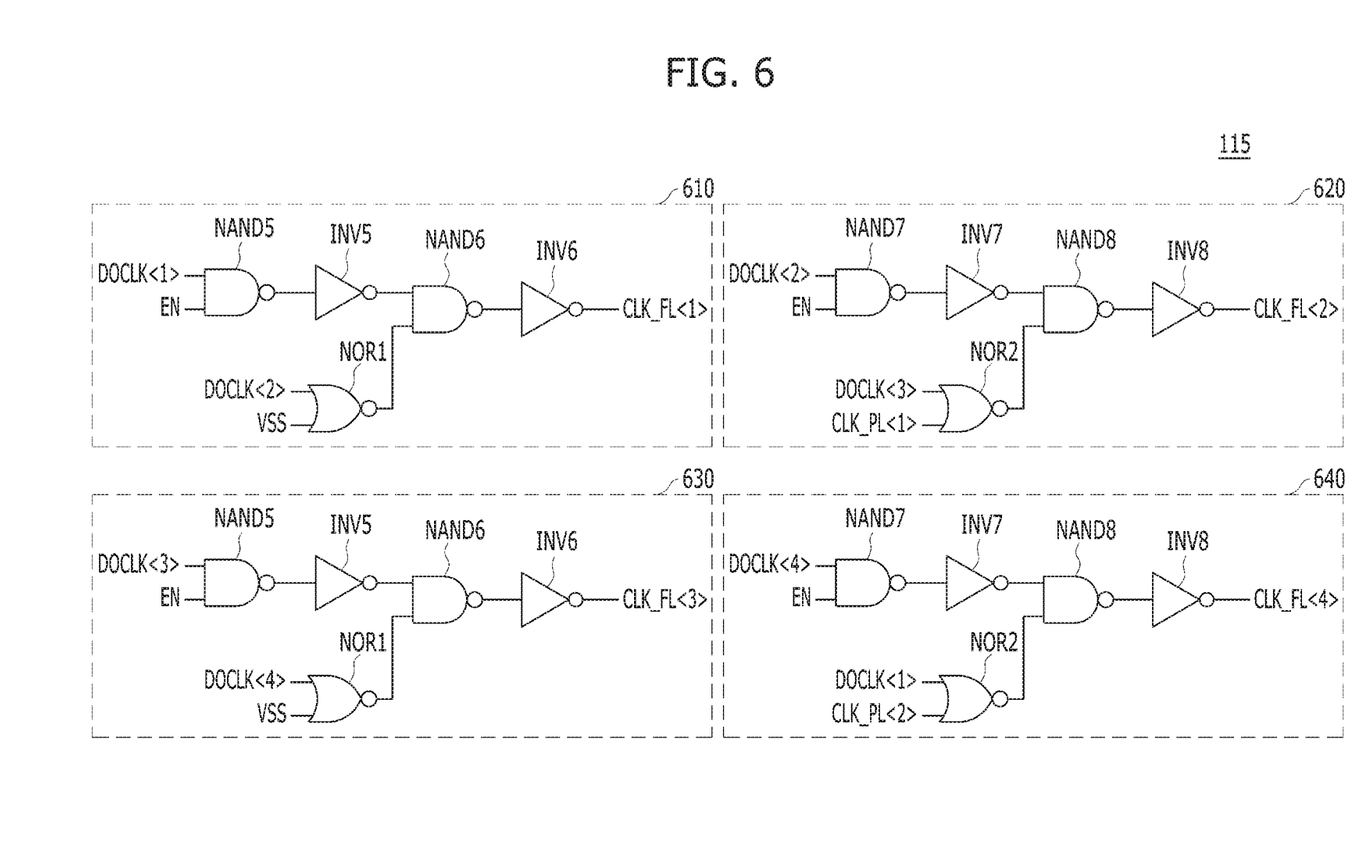
FIG. 6 is a circuit diagram illustrating a clock combination circuit illustrated in FIG. 1.

FIG. 6 is a circuit diagram illustrating the clock combination circuit 115 illustrated in FIG. 1.

Referring to FIG. 6, the clock combination circuit 115 may include first to fourth clock combination circuits 610 to 640. Each of the first and third clock combination circuits 610 and 630 may include fifth and sixth NAND gates NAND5 and NAND6, fifth and sixth inverters INV5 and INV6 and a first NOR gate NOR1. Each of the second and fourth clock combination circuits 620 and 640 may include seventh and eighth NAND gates NAND7 and NAND8, seventh and eighth inverters INV7 and INV8 and a second NOR gate NOR2. The first to fourth clock combination circuits 610 to 640 include all circuits, systems, software, firmware and devices necessary for their respective operations and functions.

The first clock combination circuit 610 may combine the first and second data output clocks DOCLK<1:2> and output the first final clock CLK_FL<1>. In an interval where the first and second data output clocks DOCLK<1:2> have a logic high level and a logic low level, respectively, the first clock combination circuit 610 may output the first final clock CLK_FL<1> at a logic high level.

At this time, an enable signal EN may be a signal which is activated during a read operation. When the first data output dock DOCLK<1> has a logic high level, the fifth NAND gate NAND5 may output a logic low-level output signal. The fifth inverter INV5 may invert the output signal of the fifth NAND gate NAND5, and input a logic high-level signal to the sixth NAND gate NAND6.

When the second data output clock DOCLK<2> has a logic low level, the first NOR gate NOR1 may output a logic high-level output signal. Therefore, in an interval where the first and second data output clocks DOCLK<1:2> have a logic high level and a logic low level, respectively, the sixth NAND gate NAND6 may output a logic low-level output signal, and the first final clock CLK_FL<1> may be activated to a logic high level.

Similarly, the third clock combination circuit 630 may combine the third and fourth data output clocks DOCLK<3:4> and output the third final clock CLKFL<3>. In an interval where the third and fourth data output clocks DOCLK<3:4> have a logic high level and a logic low level, respectively, the third clock combination circuit 630 may output the third final clock CLK_FL<3> at a logic high level.

The second clock combination circuit 620 may combine the second and third data output clocks DOCLK<2:3> and the first clock pulse CLK_PL<1>, and output the second final clock CLK_FL<2>. In an interval where the second data output clock DOCLK<2> has a logic high level and the third data output clock DOCLK<3> and the first dock pulse CLK_PL<1> have a logic low level, the second dock combination circuit 620 may output the second final clock CLK_FL<2> at a logic high level.

As described above, the enable signal EN may be a signal which is activated during a read operation. When the second data output clock DOCLK<2> has a logic high level, the seventh NAND gate NAND7 may output a logic low-level output signal. The seventh inverter INV7 may invert the output signal of the seventh NAND gate NAND7, and input a logic high-level signal to the eighth NAND gate NAND8.

When the third data output clock DOCLK<3> and the first clock pulse CLK_PL<1> have a logic low level, the second NOR gate NOR2 may output a logic high-level output signal. Therefore, in an interval where the second data output clock DOCLK<2> has a logic high level, and the third data output clock DOCLK<3> and the first clock pulse CLK_PL<1> have a logic low level, the eighth NAND gate NAND8 may output a logic low-level output signal, and the second final clock CLK_FL<2> may be activated to a logic high level.

Similarly, the fourth clock combination circuit 640 may combine the fourth data output clock DOCLK<4>, the first data output clock DOCLK<1> and the second clock pulse CLK_PL<2>, and output the fourth final clock CLK_FL<4>. In an interval where the fourth data output clock DOCLK<4> has a logic high level, and the first data output clock DOCLK<1> and the second clock pulse CLK_PL<2> have a logic low level, the fourth clock combination circuit 640 may output the fourth final clock CLK_FL<4> at a logic high level.

Figure 7A:
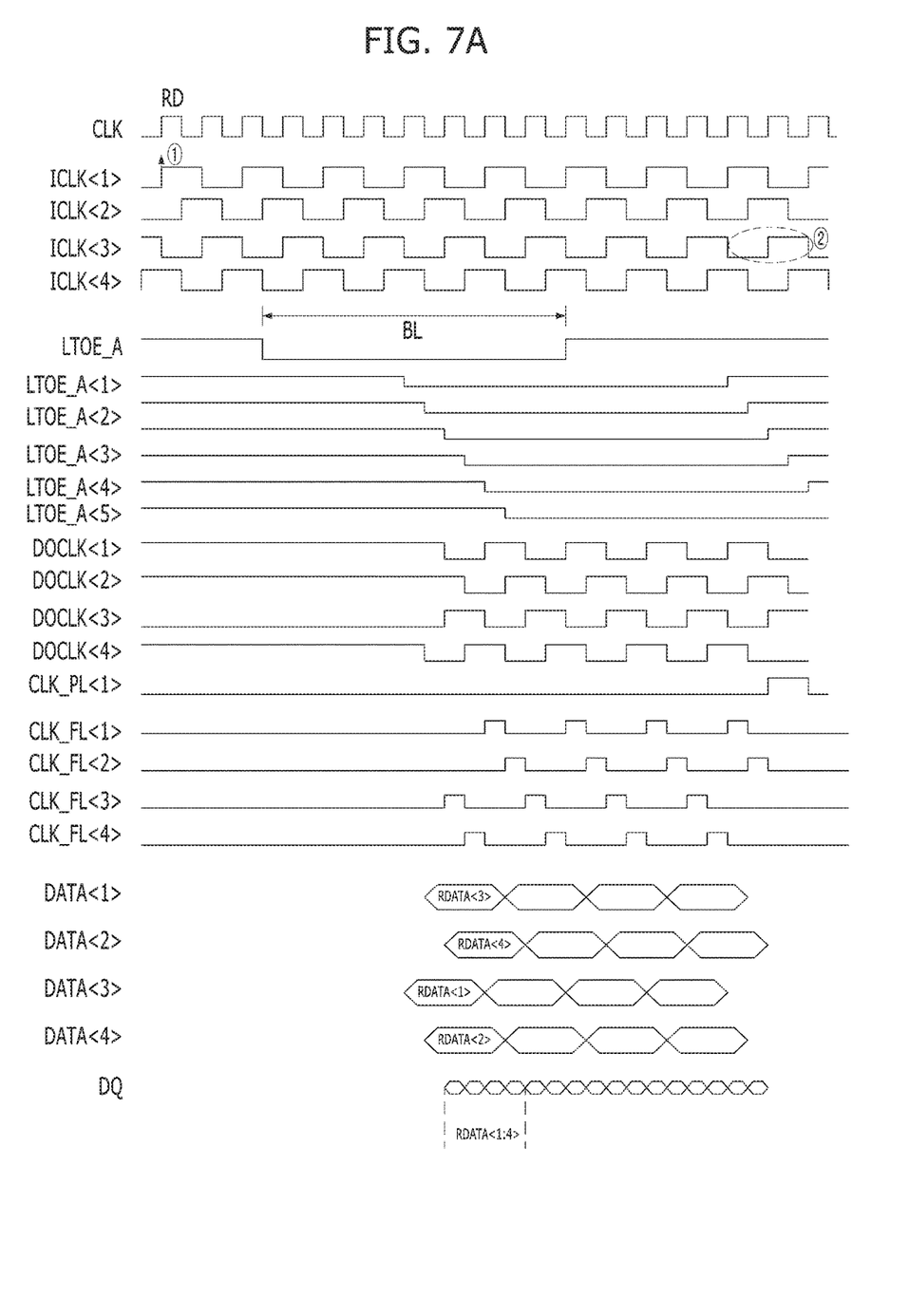
FIGS. 7A and 7B are signal waveform diagrams illustrating an operation of a memory device in accordance with an embodiment.
Figure 7B:
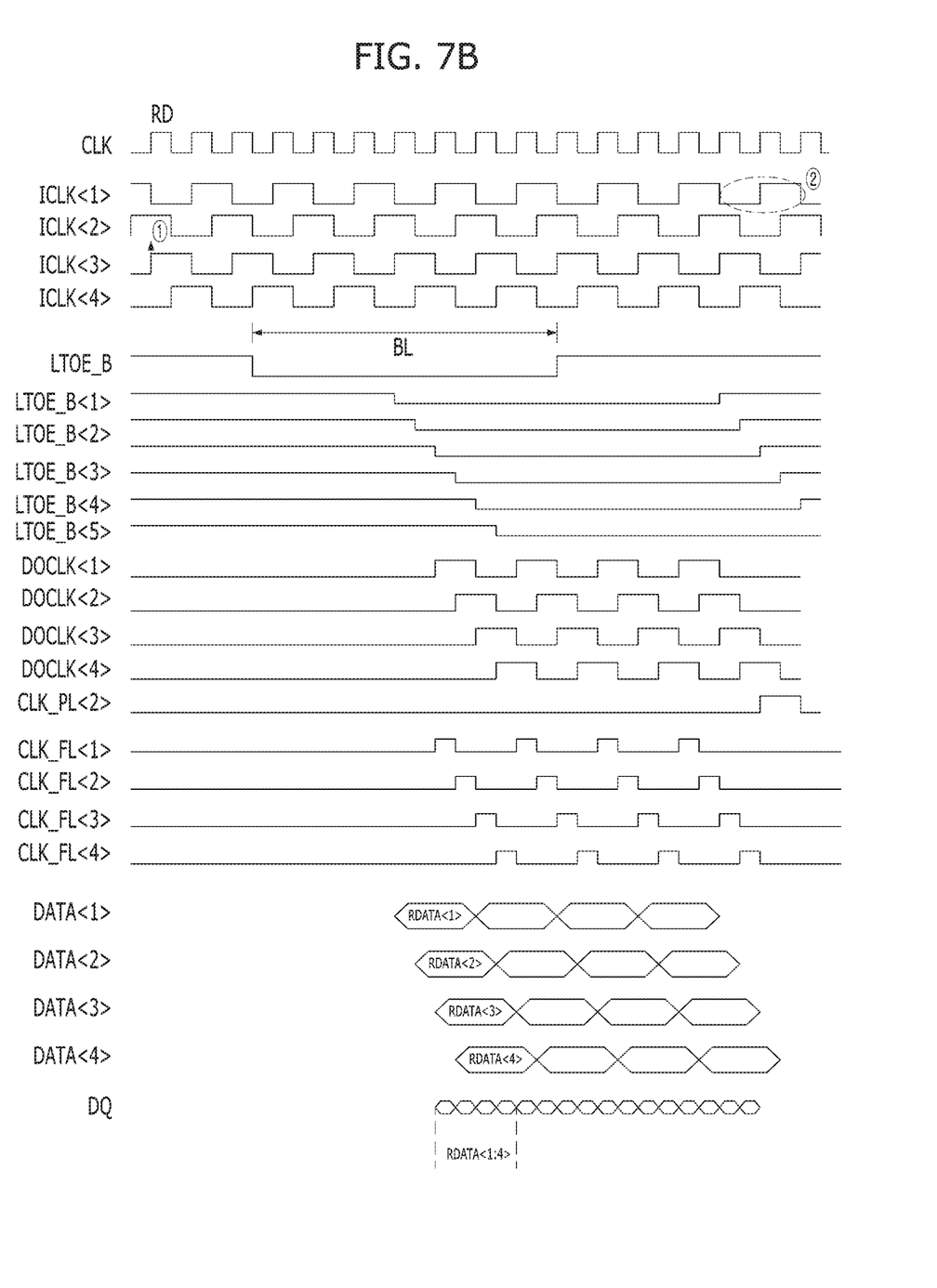

FIGS. 7A and 7B are signal waveform diagrams illustrating an operation of the memory device 100 in accordance with an embodiment. FIGS. 7A and 7B illustrate signal waveforms of the memory device 100 of FIGS. 1 to 6 at different input time points of the read command RD.

Referring to FIG. 7A, the clock dividing circuit 111 may generate the first to fourth internal clocks ICLK<1:4> having a phase difference of 90° by dividing the external clock CLK. The mode decision circuit 112 may determine an operation mode according to an input time point of the read command RD, based on the first and third internal clocks ICLK<1> and ICLK<3> among the first to fourth internal clocks ICLK<1:4>.

When the read command RD is inputted in synchronization with the first internal clock ICLK<1> (①), the mode decision circuit 112 may activate the first mode signal LTOE_A. The mode decision circuit 112 may generate the first shifting signals LTOE_A<1:5> by delaying the first mode signal LTOE_A by a time corresponding to read latency and shifting the delayed signal.

The first mode signal LTOE_A may be activated during an interval BL corresponding to a burst length. The first shifting signals LTOE_A<1:5> generated from the first mode signal LTOE_A may be used as output enable signals for enabling data output circuits according to a read operation. Although FIG. 7A illustrates five first shifting signals LTOE_A<1:5>, a plurality of shifting signals may be generated by shifting the first mode signal LTOE_A according to the positions of the data output circuits on a data path.

The clock arranging circuit 113 may transfer the third internal clock ICLK<3> as the third data output clock DOCLK<3> in response to the first first shifting signal LTOE_A<1>. Then, in response to the second to fourth first shifting signals LTOE_A<2:4> which are subsequently activated, the clock arranging circuit 113 may transfer the fourth, first and second internal clocks ICLK<4>, ICLK<1> and ICLK<2> as the fourth, first and second data output clocks DOCLK<4>, DOCLK<1> and DOCLK<2>, respectively.

The clock pulse generation circuit 114 may generate the first clock pulse CLK_PL<1> with the third internal clock ICLK<3> in response to the first and fifth first shifting signals LTOE_A<1> and LTOE_A<5>. The third internal clock ICLK<3> may be sorted as the third data output clock DOCLK<3> by the first first shifting signal LTOE_A<1> during an interval corresponding to the burst length. The clock pulse generation circuit 114 may combine the first and fifth first shifting signals LTOE_A<1> and LTOE_A<5>, and generate the first clock pulse CLK_PL<1> with a clock pulse ($\hat{2}$) of the third internal clock ICLK<3> which is activated after the interval corresponding to the burst length.

The clock combination circuit 115 may combine the first to fourth data output clocks DOCLK<1:4> and the first clock pulse CLK_PL<1>, and generate the first to fourth final clocks CLK_FL<1:4>. The clock combination circuit 115 may generate the first to fourth final clocks CLK_FL<1:4> by combining neighboring clocks among the first to fourth data output clocks DOCLK<1:4>. In particular, the clock combination circuit 115 may generate the second final clock CLK_FL<2> by combining the second and third data output clocks DOCLK<2:3> with the first clock pulse CLK_PL<1>.

When the first mode signal LTOE_A is activated, the selection circuit 121 may sort the data RDATA<1:4> inputted through the first to fourth input nodes to the third, fourth, first and second output nodes, respectively, and sequentially output the sorted data DATA<3><4><1><2>. The data serialization circuit 122 may sequentially serialize the sorted data DATA<3><4><1><2> in response to the third, fourth, first and second final clocks CLK_FL<3>, CLK_FL<4>, CLK_FL<1> and CLK_FL<2>, and output the serialized data to the data pad DQ.

Referring to FIG. 7B, when the read command RD is inputted in synchronization with the third internal clock ICLK<3> ($\hat{1}$), the mode decision circuit 112 may activate the second mode signal LTOE_B. The mode decision circuit 112 may generate the second shifting signals LTOE_B<1:5> by delaying the second mode signal LTOE_B by a time corresponding to read latency and shifting the delayed signal.

The second mode signal LTOE_B may be activated during an interval BL corresponding to the burst length. The second shifting signals LTOE_B<1:5> generated from the second mode signal LTOE_B may be used as output enable signals for enabling data output circuits according to a read operation. Although FIG. 7B illustrates five second shifting signals LTOE_B<1:5>, a plurality of shifting signals may be generated by shifting the second mode signal LTOE_B according to the positions of the data output circuits on the data path.

The clock arranging circuit 113 may transfer the first internal clock ICLK<1> as the first data output clock DOCLK<1> in response to the first second shifting signal LTOE_B<1>. Then, in response to the second to fourth second shifting signals LTOE_B<2:4> which are subsequently activated, the clock arranging circuit 113 may transfer the second to fourth internal clocks ICLK<2:4> as the second to fourth data output clocks DOCLK<2:4>, respectively.

The clock pulse generation circuit 114 may generate the second clock pulse CLK_PL<2> with the first internal clock ICLK<1> in response to the first and fifth second shifting signals LTOE_B<1> and LTOE_B<5>. The first internal clock ICLK<1> may be sorted as the first data output clock DOCLK<1> by the first second shifting signal LTOE_B<1> during an interval corresponding to the burst length. The clock pulse generation circuit 114 may combine the first and fifth second shifting signals LTOE_B<1> and LTOE_B<5>, and generate the second clock pulse CLK_PL<2> with a clock pulse ($\hat{2}$) of the first internal clock ICLK<1> which is activated after the interval corresponding to the burst length.

The clock combination circuit 115 may generate the first to fourth final clocks CLK_FL<1:4> by combining the first to fourth data output clocks DOCLK<1:4> and the second clock pulse CLK_PL<2>. The clock combination circuit 115 may generate the first to fourth final clocks CLK_FL<1:4> by combining neighboring clocks among the first to fourth data output clocks DOCLK<1:4>. In particular, the clock combination circuit 115 may generate the fourth final clock CLK_FL<4> by combining the fourth and first data output clocks DOCLK<4> and DOCLK<1> with the second clock pulse CLK_PL<2>.

When the second mode signal LTOE_B is activated, the selection circuit 121 may sort the data RDATA<1:4> inputted through the first to fourth input nodes for the first to fourth output nodes, respectively, and sequentially output the sorted data DATA<1:4>. The data serialization circuit 122 may sequentially serialize the sorted data DATA<1:4> and output the serialized data to the data pad DQ in response to the first to fourth final clocks CLK_FL<1:4>.

In accordance with the present embodiments, the memory device may generate a clock pulse according to the burst length of data from an input time point of a command, and generate internal clocks by dividing an external clock using the generated clock pulse. Therefore, the memory device may minimize the number of clocks which are toggled to generate the internal docks, thereby reducing current consumption.

When generating the internal clocks by dividing the external clocks, the memory device may adjust the sorting order of the internal clocks according to the input time point of the command. Therefore, regardless of the input time point of the command, the memory device can secure a constant valid window of data which are sorted and inputted/outputted based on the internal clocks.

Although various embodiments have been described for illustrative purposes, it will be apparent to those skilled in the art that various changes and modifications may be made without departing from the spirit and scope of the invention as defined in the following claims.

What is claimed is:
1. A clock generation circuit comprising:
a clock dividing circuit configured to generate a first internal clock, a second internal clock, a third internal clock and a fourth internal clock by dividing an external clock;
a mode signal generation circuit configured to generate a first mode signal and a second mode signal according to an input time point of a read command based on the first and third internal clocks;
a first shifting circuit configured to generate a plurality of first shifting signals by shifting the first mode signal in response to the first internal clock;
a second shifting circuit configured to generate a plurality of second shifting signals by shifting the second mode signal in response to the third internal clock; and a clock arranging circuit configured to arrange the first to fourth internal clocks and output the arranged clocks as a first data output clock, a second data output clock, a third data output clock and a fourth data output clock, in response to the plurality of first and second shifting signals, wherein the mode signal generation circuit activates the first mode signal when the read command is inputted in synchronization with the first internal clock, and activates the second mode signal when the read command is inputted in synchronization with the third internal clock.

2. The clock generation circuit of claim 1, wherein the first to fourth internal clocks correspond to first rising and falling edges and second rising and falling edges of the external clock, respectively, and have a phase difference of 90° from each other.

3. The clock generation circuit of claim 1, wherein the first and second mode signals are activated during an interval corresponding to a burst length.

4. The clock generation circuit of claim 1, further comprising:
a clock pulse generation circuit configured to generate a first clock pulse and a second clock pulse with the third and first internal clocks, respectively, in response to the plurality of first and second shifting signals.

5. The clock generation circuit of claim 4, wherein the first shifting circuit delays the first mode signal by a time corresponding to read latency in synchronization with the first internal clock, and generates the plurality of first shifting signals having a phase difference corresponding to 90° of the first internal clock by shifting the delayed signal.

6. The clock generation circuit of claim 5, wherein the second shifting circuit delays the second mode signal by the time corresponding to the read latency in synchronization with the third internal clock, and generates the plurality of second shifting signals having a phase difference corresponding to 90° of the third internal clock by shifting the delayed signal.

7. The clock generation circuit of claim 6, wherein the clock arranging circuit comprises:
a first clock transfer circuit configured to transfer the first internal clock as the first data output clock in response to a third signal of the first shifting signals and a first signal of the second shifting signals;
a second clock transfer circuit configured to transfer the second internal clock as the second data output clock in response to a fourth signal of the first shifting signals and a second signal of the second shifting signals;
a third clock transfer circuit configured to transfer the third internal clock as the third data output clock in response to a first signal of the first shifting signals and a third signal of the second shifting signals; and
a fourth clock transfer circuit configured to transfer the fourth internal clock as the fourth data output clock in response to a second signal of the first shifting signals and a fourth signal of the second shifting signals.

8. The clock generation circuit of claim 6, wherein the clock pulse generation circuit comprises:
a first clock pulse generation circuit configured to output the third internal clock as the first clock pulse in response to first and fifth signals of the plurality of first shifting signals; and
a second clock pulse generation circuit configured to output the first internal clock as the second clock pulse in response to first and fifth signals of the plurality of second shifting signals.

9. The clock generation circuit of claim 4, further comprising:
a clock combination circuit configured to combine the first to fourth data output clocks with the first and second clock pulses and output the combined clocks as a first final clock, a second final clock, a third final clock and a fourth final clock.

10. The clock generation circuit of claim 9, wherein the clock combination circuit comprises:
a first clock combination circuit configured to output the first final clock at a logic high level in an interval where the first and second data output clocks have a logic high level and a logic low level, respectively;
a second clock combination circuit configured to output the second final clock at a logic high level in an interval where the second data output clock has a logic high level and the third data output clock and the first clock pulse have a logic low level;
a third clock combination circuit configured to output the third final clock at a logic high level in an interval where the third and fourth data output clocks have a logic high level and a logic low level, respectively; and
a fourth clock combination circuit configured to output the fourth final clock at a logic high level in an interval where the fourth data output clock has a logic high level and the first data output clock and the second clock pulse have a logic low level.

11. A memory device comprising:
a clock dividing circuit configured to generate a plurality of internal clocks by dividing an external clock;
a mode decision circuit configured to determine an operation mode according to an input time point of a read command based on the internal clocks comprising first to fourth internal clocks;
a clock arranging circuit configured to arrange the internal clocks in an order determined according to the operation mode, and output the arranged clocks as a plurality of data output clocks; and
a data arranging circuit configured to arrange read data according to the operation mode, and output the arranged data in response to the data output clocks,
wherein the mode decision circuit comprises:
a mode signal generation circuit configured to activate a first mode signal when the read command is inputted in synchronization with the first internal clock, and activate a second mode signal when the read command is inputted in synchronization with the third internal clock.

12. The memory device of claim 11, wherein the internal clocks correspond to first rising and falling edges and second rising and falling edges of the external clock, respectively, and have a phase difference of 90° from each other.

13. The memory device of claim 12, wherein the mode decision circuit further comprises:
a first shifting circuit configured to delay the first mode signal by a time corresponding to read latency, and generate a plurality of first shifting signals having a phase difference corresponding to 90° of the first internal clock by shifting the delayed signal; and
a second shifting circuit configured to delay the second mode signal by the time corresponding to the read latency, and generate a plurality of second shifting signals having a phase difference corresponding to 90° of the third internal clock by shifting the delayed signal.

14. The memory device of claim 13, further comprising:
a clock pulse generation circuit configured to generate a first clock pulse and a second clock pulse with the third and first internal clocks, respectively, in response to the plurality of first and second shifting signals.

15. The memory device of claim 14, wherein the clock pulse generation circuit comprises:
a first clock pulse generation circuit configured to output the third internal clock as the first clock pulse in response to first and fifth signals of the plurality of first shifting signals; and
a second clock pulse generation circuit configured to output the first internal clock as the second clock pulse in response to first and fifth signals of the plurality of second shifting signals.

16. The memory device of claim 14, wherein the clock arranging circuit transfers the first to fourth internal clocks as first to fourth data output clocks of the data output clocks in response to third, fourth, first and second signals of the first shifting signals, respectively, and transfers the first to fourth internal clocks as the first to fourth data output clocks in response to first to fourth signals of the second shifting signals, respectively.

17. The memory device of claim 16, further comprising:
a clock combination circuit configured to combine the first to fourth data output clocks with the first and second clock pulses and output the combined clocks as a first final clock, a second final clock, a third final clock and a fourth final clock,
wherein the data arranging circuit outputs the arranged data in response to the first to fourth final clocks.

18. The memory device of claim 13, wherein the data arranging circuit comprises:
a selection circuit configured to arrange data inputted through a first input node, a second input node, a third input node and a fourth input node and output the arranged data to a first output node, a second output node, a third output node and a fourth output node, in response to the first and second mode signals; and
a data serialization circuit configured to output data inputted in parallel from the first to fourth output nodes as serial data in response to the data output clocks.

19. The memory device of claim 18, wherein the selection circuit outputs the data inputted through the first to fourth input nodes to the third, fourth, first and second output nodes, respectively, when the first mode signal is activated, and outputs the data inputted through the first to fourth input nodes to the first to fourth output nodes, respectively, when the second mode signal is activated.

20. A memory device comprising:
a clock generation circuit configured to receive an external clock, generate a plurality of internal clocks comprising first to fourth internal clocks by dividing the external clock, arrange the plurality of internal clocks according to an operation mode comprising a first mode or a second mode, which is determined based on an input timing of a read command, to generate a plurality of data output clocks, activate a first mode signal corresponding to the first mode when the read command is inputted in synchronization with the first internal clock, and activate a second mode signal corresponding to the second mode when the read command is inputted in synchronization with the third internal clock; and
a data arranging circuit configured to receive a plurality of data in parallel from a memory cell array, arrange the plurality of data according to the operation mode to generate arranged multiple data and serialize the arranged multiple data to output serialized data according to the plurality of data output clocks.

* * * * *